(12) United States Patent
Nakagawa

(10) Patent No.: US 11,825,747 B2
(45) Date of Patent: Nov. 21, 2023

(54) ACTUATOR

(71) Applicant: TOYOTA JIDOSHA KABUSHIKI KAISHA, Toyota (JP)

(72) Inventor: Shuji Nakagawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 1 day.

(21) Appl. No.: 17/658,365

(22) Filed: Apr. 7, 2022

(65) Prior Publication Data

US 2022/0328751 A1 Oct. 13, 2022

(30) Foreign Application Priority Data

Apr. 12, 2021 (JP) .................................. 2021-066986

(51) Int. Cl.
*H02N 1/00* (2006.01)
*H10N 30/20* (2023.01)

(52) U.S. Cl.
CPC .......... *H10N 30/2027* (2023.02); *H02N 1/006* (2013.01)

(58) Field of Classification Search
CPC ..................................................... H02N 1/006
See application file for complete search history.

(56) References Cited

U.S. PATENT DOCUMENTS

| | | | |
|---|---|---|---|
| 7,154,362 B2 * | 12/2006 | Ohnstein | B25J 9/065 335/229 |
| 2010/0066203 A1 | 3/2010 | Takeuchi et al. | |
| 2021/0344284 A1 * | 11/2021 | Makinen | H02N 1/006 |

FOREIGN PATENT DOCUMENTS

| | | |
|---|---|---|
| JP | 2010068667 A | 3/2010 |
| JP | 5714200 B2 | 3/2015 |
| JP | 2021132496 A | 1/2021 |
| WO | 2021015202 A1 | 1/2021 |

* cited by examiner

*Primary Examiner* — Burton S Mullins
(74) *Attorney, Agent, or Firm* — Dickinson Wright, PLLC

(57) ABSTRACT

An actuator has a plurality of pairs of a flexible electrode having flexibility, and a base electrode having an opposed face that is opposed to the flexible electrode and is covered with an insulating layer. The flexible electrode is configured to deform to get closer to the opposed face when a voltage is applied to the flexible electrode and the base electrode. Each of the pairs is located on the same axis, and adjacent ones of the pairs are connected to each other. The axis intersects with the opposed face of the base electrode of each of the pairs. The base electrode of each of the pairs is divided into a plurality of electrode portions insulated from each other, and the voltage is individually applied to the electrode portions.

4 Claims, 11 Drawing Sheets

ACTUATOR

CROSS-REFERENCE TO RELATED APPLICATION

This application claims priority to Japanese Patent Application No. 2021-066986 filed on Apr. 12, 2021, incorporated herein by reference in its entirety.

BACKGROUND

1. Technical Field

The disclosure relates to an actuator.

2. Description of Related Art

A soft actuator that performs mechanical work, using deformation of a member having flexibility as power, is known (see, for example, Japanese Patent No. 5714200 (JP 5714200 B)).

An actuator in which an electroactive polymer is sandwiched between a pair of electrodes is described in JP 5714200 B. In the actuator described in JP 5714200 B, the pair of electrodes are attracted to each other, under coulomb force of electric charge accumulated when voltage is applied to the electrodes, and the electroactive polymer deforms, to generate displacement between the electrodes.

SUMMARY

The actuator described in JP 5714200 B can merely make simple motions, such as a linear motion in a direction along the distance between the electrodes or a direction along the electrodes, and it is difficult for the actuator to achieve complex motions.

This disclosure provides an actuator that can achieve complex motions.

An actuator according to one aspect of the disclosure includes a plurality of pairs of a flexible electrode having flexibility, and a base electrode having an opposed face that is opposed to the flexible electrode and is covered with an insulating layer. The flexible electrode is configured to deform to get closer to the opposed face when a voltage is applied to the flexible electrode and the base electrode. Each of the pairs is located on the same axis, and adjacent ones of the pairs are connected to each other. The axis intersects with the opposed face of the base electrode of each of the pairs. The base electrode of each of the pairs is divided into a plurality of electrode portions insulated from each other, and the voltage is individually applied to the electrode portions.

With the above arrangement, the flexible electrode of each of the pairs can deform into various forms, according to the electrode portion to which a voltage is applied. When an output member that generates work of the actuator to the outside is attached to the flexible electrode, moments having various directions and magnitudes are applied to the output member, according to deformation of the flexible electrode. The output member can be displaced into various postures. Thus, the actuator of the disclosure can achieve complex motions.

In the actuator as described above, the base electrode may be formed in the shape of a dome having a top portion at a position opposed to the flexible electrode, and the electrode portions may be arranged along an orbital direction of the axis. The voltage may be sequentially applied to the electrode portions along the orbital direction.

With the above arrangement, when the output member is attached to the flexible electrode, the output member is displaced so as to turn in the orbital direction of the axis. The actuator can achieve turning motion. Thus, the actuator can achieve complex motions.

In the actuator as described above, the flexible electrode of one of adjacent ones of the pairs and the base electrode of the other pair may be connected by a connecting member, and the connecting member may be formed from an elastic body.

With the above arrangement, when the output member is attached to the flexible electrode, the amount of displacement of the output member can be increased, and the output member can easily return to the initial position. The actuator can increase the amount of movement, and increase the moving speed. Thus, the actuator can achieve high output.

In the actuator as described above, the flexible electrode of one of adjacent ones of the pairs and the base electrode of the other pair may be connected by a connecting member, and the connecting member may be formed from a conductor.

With the above arrangement, the flexible electrode of one of the adjacent pairs and the base electrode of the other pair can be at the same potential. A drive circuit of the actuator can be simplified. Thus, the actuator can easily achieve complex motions.

In the actuator as described above, the flexible electrode of one of adjacent ones of the pairs and the flexible electrode of the other pair may be opposed to each other, and may be connected by a connecting member. The connecting member may be formed from an insulating body.

With the above arrangement, when the order of application of voltage to the electrode portions that constitute the base electrode of one of adjacent ones of the pairs is opposite to the order of application of voltage to the electrode portions that constitute the base electrode of the other pair of the adjacent pairs, each flexible electrode deforms so as to be twisted about the axis as a central axis. The actuator can achieve twisting motion about the axis as the central axis. Thus, the actuator can achieve complex motions.

According to the disclosure, the actuator that can achieve complex motions can be provided.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
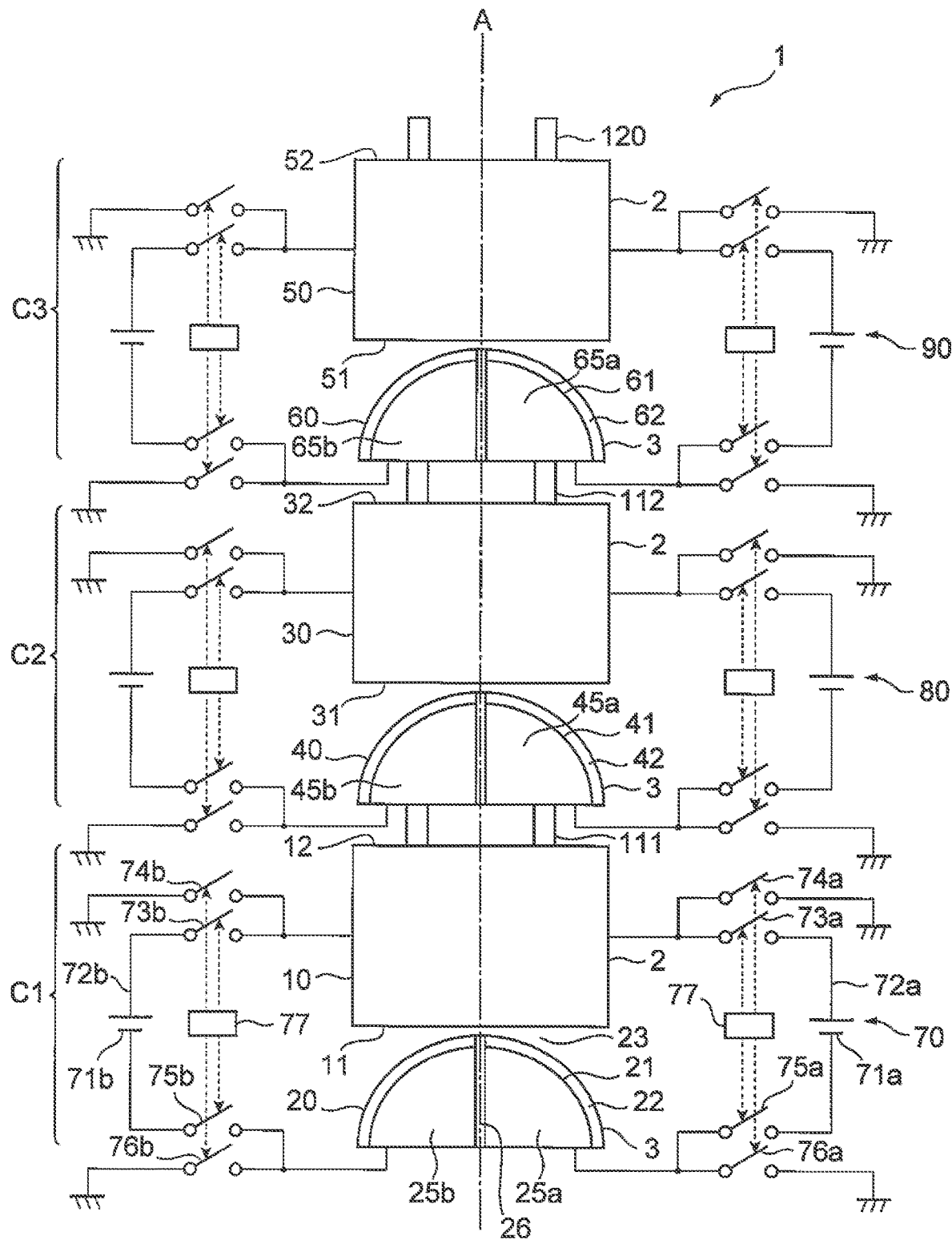
FIG. 1 is a view schematically showing the configuration of an actuator of a first embodiment.

Some embodiments of the disclosure will be described with reference to the drawings. Constituent elements to which the same reference signs are assigned in each of the embodiments have substantially the same functions in the embodiments, unless particularly mentioned otherwise, and the elements will not be further described.

In the embodiments below, a first flexible electrode 10, a second flexible electrode 30, and a third flexible electrode 50, which will be described later, will be generally called "flexible electrode 2". In the embodiments below, a first base electrode 20, a second base electrode 40, and a third base electrode 60, which will be described later, will be generally called "base electrode 3".

First Embodiment

Figure 2:
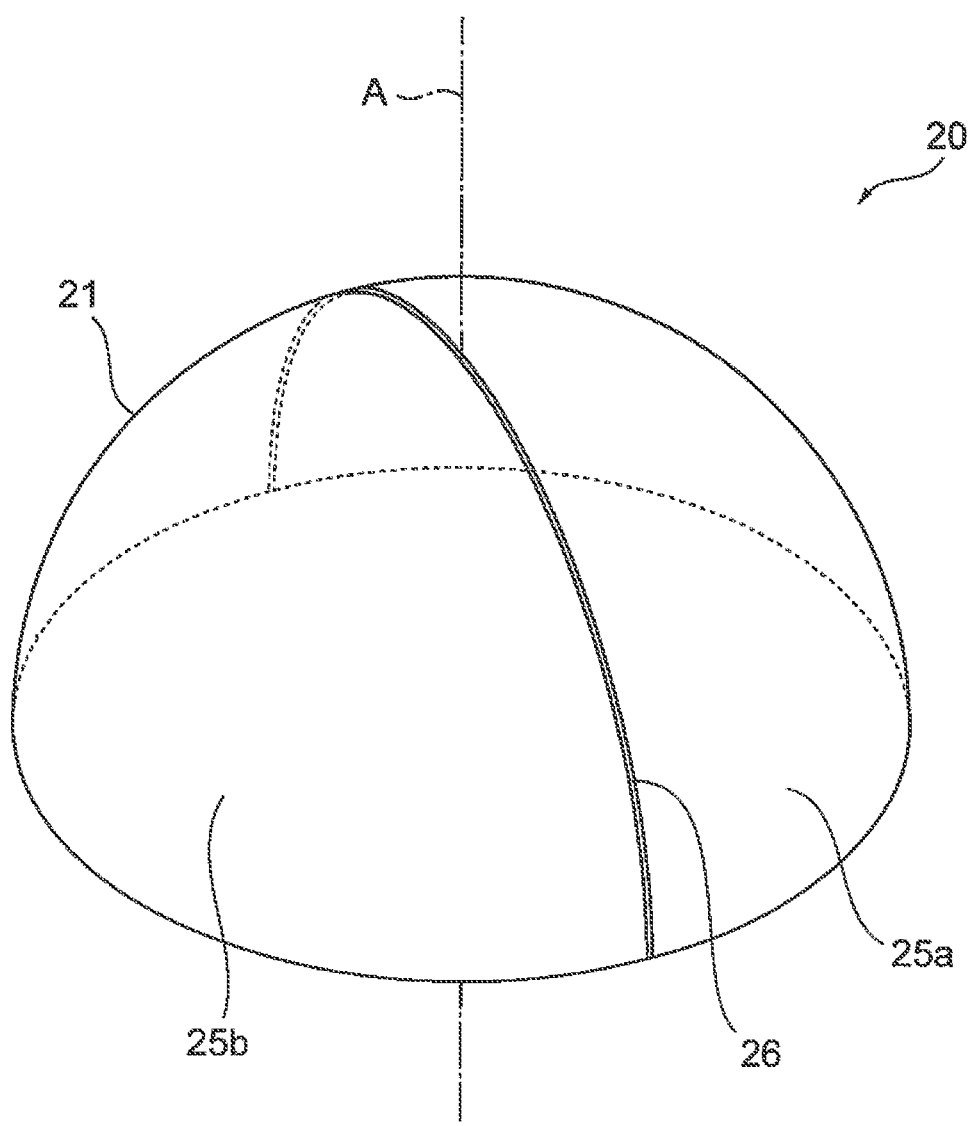
FIG. 2 is a perspective view of a base electrode shown in FIG. 1.

Referring to FIG. 1 to FIG. 6, an actuator 1 according to a first embodiment will be described. FIG. 1 schematically shows the configuration of the actuator 1 of the first embodiment. FIG. 2 is a perspective view of a base electrode 3 shown in FIG. 1. In FIG. 2, a first base electrode 20 as one of the base electrodes 3 is typically illustrated. In FIG. 2, an insulating layer 22 is not illustrated.

The actuator 1 is a soft actuator that performs mechanical work, using deformation of the flexible electrodes 2 having flexibility as power. Unlike a conventional soft actuator that has a dielectric elastomer sandwiched between a pair of electrodes, and uses deformation of the dielectric elastomer as power, each of the flexible electrodes 2 itself deforms in the actuator 1. The actuator 1 may be used in various robots, power assist suits that reduce physical burdens of users, and various actuators used in artificial muscles or artificial joints, for example.

Figure 3:
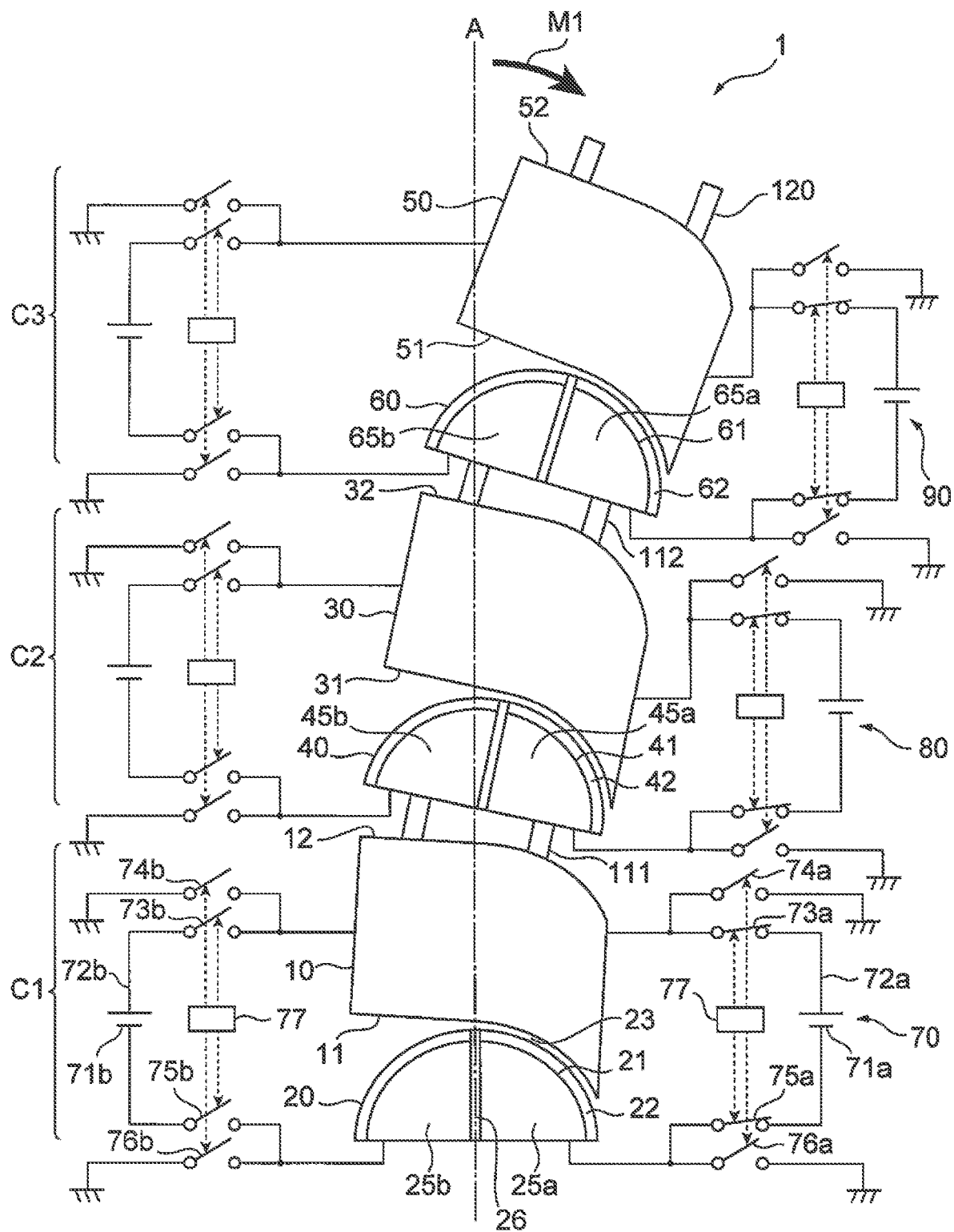
FIG. 3 is a view showing the actuator in a condition where voltages are applied to flexible electrodes and base electrodes shown in FIG. 1.

In the actuator 1 of the first embodiment, the flexible electrode 2 is deformed by use of coulomb force generated when a voltage is applied to the flexible electrode 2 and the base electrode 3, such that the flexible electrode 2 gets closer to an opposed face of the base electrode 3 that is opposed to the flexible electrode 2 (see FIG. 3). Then, the actuator 1 stops applying the voltage to the electrodes 2, 3, so that the flexible electrode 2 reverts to its original shape (see FIG. 4). By repeating application and stop of voltage in this manner, the actuator 1 can achieve swinging motions.

The actuator 1 has two or more pairs of electrodes, each of which consists of the flexible electrode 2 and the base electrode 3. The number of the pairs is arbitrarily selected. The actuator 1 of this embodiment includes a first pair C1 as a pair of a first flexible electrode 10 and a first base electrode 20, a second pair C2 as a pair of a second flexible electrode 30 and a second base electrode 40, and a third pair C3 as a pair of a third flexible electrode 50 and a third base electrode 60. In the actuator 1 of this embodiment, voltage is applied to the flexible electrode 2 and base electrode 3 that constitute each of the pairs C1 to C3.

Each of the pairs C1 to C3 is located on the same axis, such that adjacent ones of the pairs are connected to each other. More specifically, the respective pairs C1 to C3 are arranged in series on an axis A. The first pair C1 and second pair C2 located adjacent to each other are connected by a connecting member 111. The second pair C2 and third pair C3 located adjacent to each other are connected by a connecting member 112.

The axis A intersects with opposed faces 21, 41, 61 of the respective base electrodes 3 of the pairs C1 to C3 which are opposed to the flexible electrodes 2. More specifically, the axis A intersects at right angles with the opposed face 21 of the first base electrode 20 opposed to the first flexible electrode 10, the opposed face 41 of the second base electrode 40 opposed to the second flexible electrode 30, and the opposed face 61 of the third base electrode 60 opposed to the third flexible electrode 50.

The first flexible electrode 10 is formed from a conductor having flexibility. The flexibility of the first flexible electrode 10 is set to such a degree that the first flexible electrode 10 deforms under the action of coulomb force generated upon application of voltage to the first flexible electrode 10 and the first base electrode 20, and reverts to its original shape (the shape before deformation, namely, the shape before application of the voltage) when application of the voltage is stopped.

The first flexible electrode 10 may be formed using conductive rubber or conductive gel, for example. The conductive rubber may be an elastomer formed with a conductive material mixed thereto, for example. The conductive material may be selected from a fine powder of carbon black, acetylene black, or carbon nanotube, metallic fine powder of silver or copper, conductive fine powder of a core-shell structure formed by coating an insulator of silica or alumina with a metal by sputtering, for example, and so forth. The above-mentioned conductive gel may be a functional gel material in which a solvent, such as water or a moisturizing agent, electrolyte, additive, etc. are held in a three-dimensional polymer matrix, for example. One example of the functional gel material is ST-gel (registered trademark) of Sekisui Kasei Co., Ltd.

The first flexible electrode 10 is formed in a three-dimensional shape. In this embodiment, the first flexible electrode 10 is formed in polyhedron shape, e.g., in hexahedral shape. The first flexible electrode 10 has one end face 11 and the other end face 12 as end faces arranged in a direction of extension of the axis A. The one end face 11 of the first flexible electrode 10 is opposed to the first base electrode 20. The other end face 12 of the first flexible electrode 10 is opposite to the one end face 11 as viewed in the direction of extension of the axis A. The other end face 12 of the first flexible electrode 10 is opposed to the second base electrode 40 of the second pair C2. The other end face 12 of the first flexible electrode 10 is connected to the second base electrode 40 by the connecting member 111.

The first base electrode 20 is formed from a conductor having rigidity. The first base electrode 20 may be formed of a metallic material, such as iron, copper, or aluminum. The first base electrode 20 may also be formed by coating one surface of a substrate formed using a non-metallic material, such as ceramic, having heat resistance, rigidity, and insulation property, with a metallic film having conductivity, for example. The surface of the substrate coated with the metallic film is opposed to the first flexible electrode 10.

The opposed face 21 of the first base electrode 20 opposed to the first flexible electrode 10 is coated with an insulating layer 22. The insulating layer 22 is formed using a ferroelectric body formed of ceramic, so that electric charge accumulated in the first base electrode 20 through application of voltage to the first flexible electrode 10 and the first base electrode 20 is surely maintained. In particular, the insulating layer 22 is formed using a ferroelectric substance having a perovskite structure. The ferroelectric substance having the perovskite structure may be selected from, for example, barium titanate ($BaTiO_3$), lead titanate ($PbTiO_3$), lead zirconate titanate ($Pb(Zr, Ti)O_3$), lanthanum-doped lead zirconate titanate (($Pb, La)(Zr, Ti)O_3$), strontium titanate ($SrTiO_3$), strontium barium titanate (($Ba, Sr)TiO_3$), potassium sodium niobate (($NaK)NbO_3$), etc. A substance, such as $CaZrO_3$ or $BaSnO_3$, may be dissolved in barium titanate.

The material used for forming the insulating layer 22 preferably has a relative permittivity high enough to generate coulomb force that deforms the first flexible electrode 10. The relative permittivity of the insulating layer 22 may be 1000 or higher when it employs ceramics (fine ceramics). The relative permittivity of barium titanate is around 1000 to 10000. The relative permittivity of lead zirconate titanate is 500 to 5000. The relative permittivity of strontium titanate is 200 to 500. The ferroelectric substances having the perovskite structure have high relative permittivities.

The first base electrode 20 is formed in a dome-like shape having a top portion at a position opposed to the first flexible electrode 10. Namely, the opposed face 21 of the first base electrode 20 opposed to the first flexible electrode 10 is formed like a domical face, such as a hemisphere face, as shown in FIG. 2. The first base electrode 20 is located such that the central axis of the domical opposed face 21 extends along the axis A. The opposed face 21 of the first base electrode 20 is inclined relative to the first flexible electrode 10. Space 23 is formed between the first flexible electrode 10 and the first base electrode 20. The space 23 is used for receiving the first flexible electrode 10 that deforms so as to get closer to the opposed face 21 of the first base electrode 20 when a voltage is applied to the first flexible electrode 10 and the first base electrode 20.

The opposed face 21 of the first base electrode 20 is divided into two or more sections, so that the first base electrode 20 is divided into two or more electrode portions 25a, 25b. The electrode portions 25a, 25b are insulated from each other, by use of a plate-like insulating portion 26, such as a semicircular plate. With the plate-like insulating portion 26 thus provided, voltages are individually applied to the electrode portions 25a, 25b and the first flexible electrode 10. The first base electrode 20 may be divided into the electrode portion 25a as one of the electrode portions 25a, 25b and the other electrode portion 25b, such that the shapes of the electrode portions 25a, 25b are symmetrical with each other with respect to a plane including the axis A.

Each of the second flexible electrode 30 and the third flexible electrode 50 is constructed similarly to the first flexible electrode 10. Namely, one end face 31 and the other end face 32 of the second flexible electrode 30 are respectively configured similarly to the one end face 11 and the other end face 12 of the first flexible electrode 10. One end face 51 and the other end face 52 of the third flexible electrode 50 are respectively configured similarly to the one end face 11 and the other end face 12 of the first flexible electrode 10.

The other end face 32 of the second flexible electrode 30 is connected to the third base electrode 60 by the connecting member 112. In place of the connecting member 111, 112, an output member 120 is attached to the other end face 52 of the third flexible electrode 50. The output member 120 generates work of the actuator 1 to the outside of the actuator 1. The output member 120 is a driven member that is displaced according to motion of the actuator 1. The output member 120 is designed as appropriate, according to the specifications, etc. of an external system to which work of the actuator 1 is to be generated.

Each of the second base electrode 40 and the third base electrode 60 is constructed similarly to the first base electrode 20. Namely, the opposed face 41 of the second base electrode 40 is configured similarly to the opposed face 21 of the first base electrode 20. An insulating layer 42 that covers the opposed face 41 of the second base electrode 40 is constructed similarly to the insulating layer 22 of the first base electrode 20. The opposed face 61 of the third base electrode 60 is configured similarly to the opposed face 21 of the first base electrode 20. An insulating layer 62 that covers the opposed face 61 of the third base electrode 60 is constructed similarly to the insulating layer 22 of the first base electrode 20.

Also, the second base electrode 40 has one electrode portion 45a and the other electrode portion 45b that are separated by a plane including the axis A, like the one electrode portion 25a and the other electrode portion 25b that constitute the first base electrode 20. The third base electrode 60 has one electrode portion 65a and the other electrode portion 65b that are separated by a plane including the axis A, like the one electrode portion 25a and the other electrode portion 25b that constitute the first base electrode 20. Each of the electrode portions 25a, 45a, 65a of the respective base electrodes 3 of the pairs C1 to C3 is located on one side of the plane including the axis A as viewed in the normal direction. Each of the electrode portions 25b, 45b, 65b of the respective base electrodes 3 of the pairs C1 to C3 is located on the other side of the plane including the axis A as viewed in the normal direction.

The connecting member 111 connects the first flexible electrode 10 of the first pair C1 with the second base electrode 40 of the second pair C2. The connecting member 112 connects the second flexible electrode 30 of the second pair C2 with the third base electrode 60 of the third pair C3. Namely, the flexible electrode 2 of one of adjacent pairs and the base electrode 3 of the other pair are connected by the connecting member 111, 112. The connecting member 111, 112 is formed from an insulator. Preferably, the connecting member 111, 112 may be formed from an insulator, such as an insulating rubber or insulating spring, that can be elastically deformed. In other words, the connecting member 111, 112 may be formed from an elastic body having an insulating property.

The actuator 1 is connected to drive circuits 70 to 90 that drive the actuator 1 by applying voltage to the flexible electrodes 2 and the base electrodes 3. The drive circuits 70 to 90 consist of a first drive circuit 70 that applies voltage to the first flexible electrode 10 and the first base electrode 20, a second drive circuit 80 that applies voltage to the second flexible electrode 30 and the second base electrode 40, and a third drive circuit 90 that applies voltage to the third flexible electrode 50 and the third base electrode 60.

The first drive circuit 70 includes power supplies 71a, 71b each provided by a direct-current (DC) voltage source, wirings 72a, 72b that connect each constituent element of the first drive circuit 70 with the first flexible electrode 10 and the first base electrode 20, switches 73a to 76b provided by semiconductor devices, or the like, and a controller 77 provided by an integrated circuit, or the like.

The first flexible electrode 10 is connected to one of the positive electrode and negative electrode of the power supply 71a via the wiring 72a, and is also connected to a frame ground (or grounded). The electrode portion 25a of the first base electrode 20 is connected to the other of the positive electrode and negative electrode of the power supply 71a via the wiring 72a, and is also connected to the frame ground. A switch 73a is connected between the first flexible electrode 10 and the power supply 71a. A switch 74a is connected between the first flexible electrode 10 and the frame ground. A switch 75a is connected between the electrode portion 25a and the power supply 71a. A switch 76a is connected between the electrode portion 25a and the frame ground.

Also, the first flexible electrode 10 is connected to one of the positive electrode and negative electrode of the power supply 71b via the wiring 72b, and is also connected to the frame ground. The electrode portion 25b of the first base electrode 20 is connected to the other of the positive electrode and negative electrode of the power supply 71b via the wiring 72b, and is also connected to the frame ground. A switch 73b is connected between the first flexible electrode 10 and the power supply 71b. A switch 74b is connected between the first flexible electrode 10 and the frame ground. A switch 75b is connected between the electrode portion 25b and the power supply 71b. A switch 76b is connected between the electrode portion 25b and the frame ground.

The controller 77 is a circuit that controls each constituent element of the first drive circuit 70. The controller 77 controls the ON/OFF states of the switches 73a to 76b, to switch between application of voltage to the first flexible electrode 10 and the first base electrode 20, and stop of application of the voltage. Also, the controller 77 controls the amounts of output voltages of the power supplies 71a, 71b, so as to control the amounts of voltages applied. In this manner, the controller 77 can control the magnitude of the coulomb force acting on the first flexible electrode 10, and can control the amount of deformation of the first flexible electrode 10. Thus, the controller 77 can control the amount of displacement of the output member 120. Further, the controller 77 controls the speed of switching between application and stop of voltage, thereby to control the speed of deformation of the first flexible electrode 10, and control the speed of displacement of the output member 120. Further, the controller 77 controls the timing of switching of application and stop of voltage, thereby to control the timing of deformation of the first flexible electrode 10, and control the timing of displacement of the output member 120.

Each of the second drive circuit 80 and the third drive circuit 90 is constructed similarly to the first drive circuit 70.

FIG. 3 shows the actuator 1 in a condition where voltages are applied to the flexible electrodes 2 and the base electrodes 3 shown in FIG. 1.

As shown in FIG. 3, when the switches 73a, 75a are controlled to the ON states, and the switches 74a, 76a are controlled to the OFF states, in the first drive circuit 70, a voltage is applied to the first flexible electrode 10 and the electrode portion 25a of the first base electrode 20. In this case, the first flexible electrode 10 connected to the positive electrode of the power supply 71a is positively charged, and the electrode portion 25a connected to the negative electrode of the power supply 71a is negatively charged. The insulating layer 22 that covers the opposed face 21 of the electrode portion 25a has a dielectric polarization. The insulating layer 22 of the electrode portion 25a is positively charged at around the interface with the electrode portion 25a, and is negatively charged at around the surface (on the space 23 side) opposite to the above interface. As a result, coulomb force is generated between the insulating layer 22 of the electrode portion 25a and the first flexible electrode 10. With the coulomb force, the first flexible electrode 10 is attracted to the insulating layer 22 of the electrode portion 25a. Namely, the coulomb force causes the first flexible electrode 10 to deform so as to get closer to the opposed face 21 of the electrode portion 25a of the first base electrode 20. With the first flexible electrode 10 thus deformed, the second base electrode 40 connected to the first flexible electrode 10 is displaced so as to be inclined along the opposed face 21 of the electrode portion 25a. A moment as indicated by arrow M1 in FIG. 3 is applied to the output member 120. As a result, the output member 120 is displaced so as to be inclined relative to the axis A, as indicated by arrow M1 shown in FIG. 3.

In each of the second drive circuit 80 and the third drive circuit 90, too, when the ON/OFF states of the switches are controlled, in the same manner as in the first drive circuit 70, each of the second flexible electrode 30 and the third flexible electrode 50 deforms similarly to the first flexible electrode 10. Thus, the output member 120 can be displaced so as to be further inclined relative to the axis A.

Figure 4:
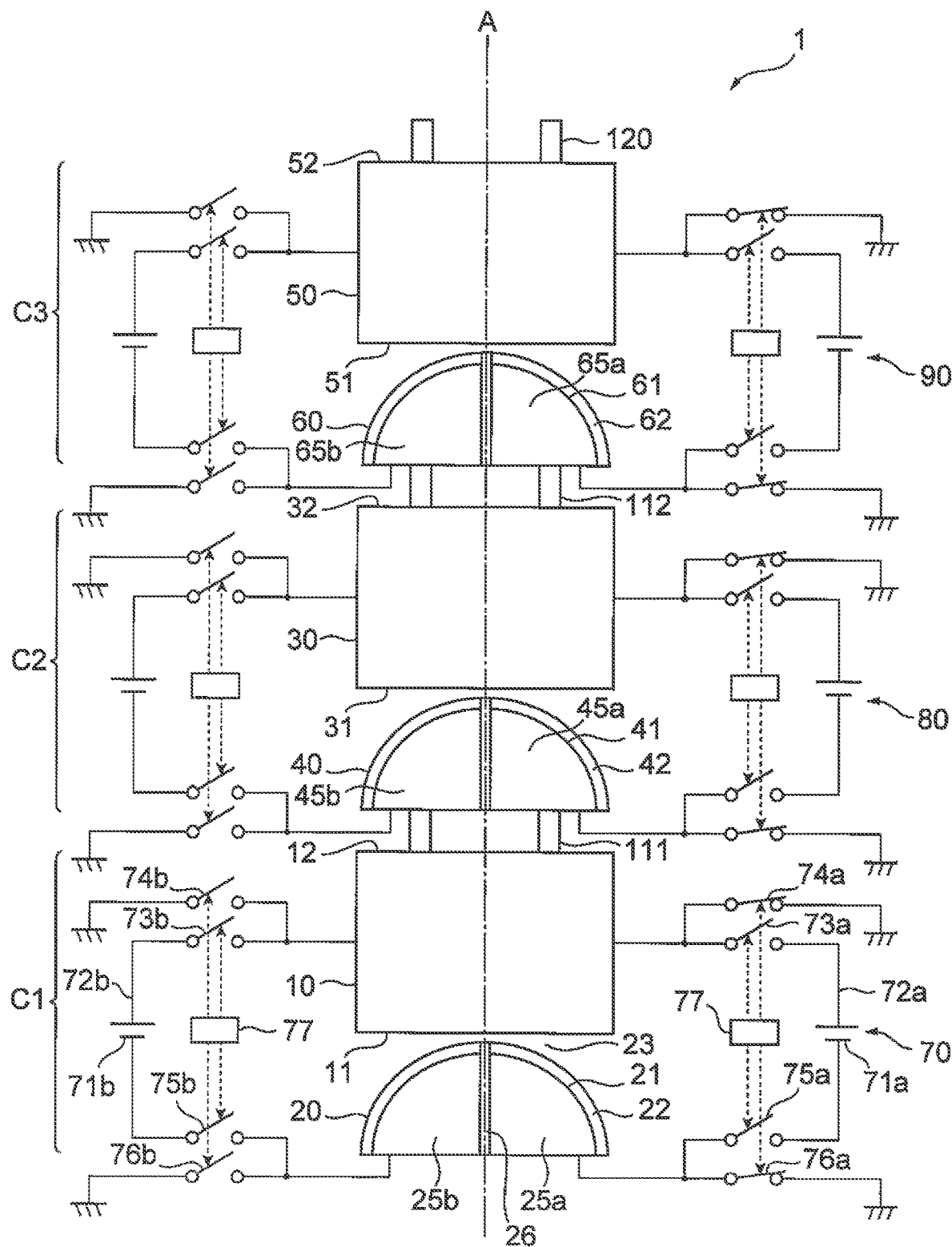
FIG. 4 is a view showing the actuator in a condition where application of the voltages is stopped after the condition shown in FIG. 3.

FIG. 4 shows the actuator 1 in a condition where application of the voltage is stopped after the condition shown in FIG. 3.

As shown in FIG. 4, in the first drive circuit 70, when the switches 73a, 75a are controlled to the OFF states, and the switches 74a, 76a are controlled to the ON states, after the condition shown in FIG. 3, the voltage stops being applied to the first flexible electrode 10 and the electrode portion 25a of the first base electrode 20. In this case, the electric charge accumulated in the first flexible electrode 10 and the electrode portion 25a of the first base electrode 20 is released to the frame ground. The first flexible electrode 10 deforms so as to be spaced apart from the opposed face 21 of the electrode portion 25a under the restoring force of the first flexible electrode 10, and reverts to the original shape. With the first flexible electrode 10 thus restored, the second base electrode 40 connected to the first flexible electrode 10 returns to the initial position before displacement (namely, before the above voltage is applied).

In each of the second drive circuit 80 and the third drive circuit 90, when the ON/OFF states of the switches are controlled, in the same manner as in the first drive circuit 70, each of the second flexible electrode 30 and the third flexible electrode 50 reverts to the original shape, like the first flexible electrode 10. With the first flexible electrode 10, second flexible electrode 30, and third flexible electrode 50 thus resuming the original shapes, the output member 120 can return to the initial position.

In the first drive circuit 70, when the switches 73b, 75b are controlled to the ON states, and the switches 74b, 76b are controlled to the OFF states, after the condition shown in FIG. 4, a voltage is applied to the first flexible electrode 10 and the electrode portion 25b of the first base electrode 20. The first flexible electrode 10 deforms so as to get closer to the opposed face 21 of the electrode portion 25b of the first base electrode 20. The output member 120 is displaced so as to be inclined in a direction opposite to that indicated by arrow M1 shown in FIG. 3. In each of the second drive circuit 80 and the third drive circuit 90, too, when the ON/OFF states of the switches are controlled in the same manner as in the first drive circuit 70, the output member 120 is displaced so as to be further inclined in the direction opposite to that of arrow M1 shown in FIG. 3.

Then, in the first drive circuit 70, when the switches 73b, 75b are controlled to the OFF states, and the switches 74b, 76b are controlled to the ON states, application of voltage to the first flexible electrode 10 and the electrode portion 25b of the first base electrode 20 is stopped. As a result, the first flexible electrode 10 deforms so as to be spaced apart from the opposed face 21 of the electrode portion 25b under the restoring force of the first flexible electrode 10, and reverts to its original shape. In each of the second drive circuit 80 and the third drive circuit 90, too, when the ON/OFF states of the switches are controlled, in the same manner as in the first drive circuit 70, each of the second flexible electrode 30 and the third flexible electrode 50 reverts to its original shape, like the first flexible electrode 10. The output member 120 can return to the initial position.

As described above, the drive circuits 70 to 90 can apply voltages to the one electrode portions 25a, 45a, 65a that constitute the respective base electrodes 3 of the pairs C1 to C3 at the same time, and then stop application of the voltages at the same time. Then, the drive circuits 70 to 90 can apply voltages to the other electrode portions 25b, 45b, 65b that constitute the respective base electrodes 3 of the pairs C1 to C3 at the same time, and then stop application of the voltages at the same time. Thus, the drive circuits 70 to 90 switch between application of the voltages and stop of the application, separately with respect to the one electrode portions 25a, 45a, 65a that constitute the respective base electrodes 3 of the pairs C1 to C3, and the other electrode portions 25b, 45b, 65b that constitute the respective base electrodes 3 of the pairs C1 to C3. As a result, the actuator 1 can achieve swinging motions, by swinging the output member 120 in directions intersecting with the axis A.

In this connection, the drive circuits 70 to 90 may not simultaneously apply voltages or stop applying voltages to the one electrode portions 25a, 45a, 65a that constitute the respective base electrodes 3 of the pairs C1 to C3. For example, the drive circuits 70 to 90 may apply voltages or stop applying voltages to the one electrode portions 25a, 45a, 65a, in sequence from the first pair C1 located farthest from the output member 120 to the third pair C3 to which the output member 120 is attached. The drive circuits 70 to 90 may apply voltages or stop applying voltages to the other electrode portions 25b, 45b, 65b, in the same manner. As a result, the actuator 1 can swing the output member 120 more smoothly.

As described above, the actuator 1 of the first embodiment has two or more pairs C1 to C3 of the flexible electrode 2 and the base electrode 3. The respective pairs C1 to C3 are located on the same axis A, and adjacent ones of the pairs are connected to each other. The axis A intersects with the opposed faces 21, 41, 61 of the respective base electrodes 3 of the pairs C1 to C3 which are opposed to the flexible electrodes 2. Each of the base electrodes 3 of the pairs C1 to C3 is divided into two or more electrode portions that are insulated from each other. Voltages are individually applied to the respective electrode portions.

With the above arrangement, the flexible electrode 2 of each of the pairs C1 to C3 can deform so as to get closer to a part of the electrode portions that constitute the base electrode 3 of each of the pairs C1 to C3. Namely, the flexible electrode 2 of each of the pairs C1 to C3 can deform in various forms, according to the electrode portion to which a voltage is applied. To the output member 120 connected to the flexible electrode 2, moments having various directions and magnitudes are applied, according to deformation of the flexible electrode 2. Then, the output member 120 can be displaced into various postures. Thus, the actuator 1 of the first embodiment can achieve complex motions, such as swinging motions, of the output member 120. Furthermore, since the pairs C1 to C3 are located on the same axis A, the amount of deformation of the flexible electrodes 2 as a whole is increased, so that the amount of displacement of the output member 120 can be large. In this manner, the actuator 1 of the first embodiment can increase work generated from the output member 120 to the outside. Thus, the actuator 1 of the first embodiment can not only achieve complex motions, but also achieve high output.

Further, in the actuator 1 of the first embodiment, the flexible electrode 2 of one of adjacent ones of the pairs and the base electrode 3 of the other pair are connected by the connecting member 111, 112 formed from the elastic body.

With this arrangement, the amount of displacement of the output member 120 can be further increased upon application of voltage. The actuator 1 can increase the amount of movement. Also, the output member 120 can easily return to the initial position when application of the voltage is stopped. Thus, the output member 120 can quickly respond to application and stop of voltage and can be quickly displaced, even if the application and stop of voltage is repeated at short intervals. The actuator 1 can increase the speed of movement. Accordingly, the actuator 1 of the first embodiment can achieve further higher output.

Figure 5:
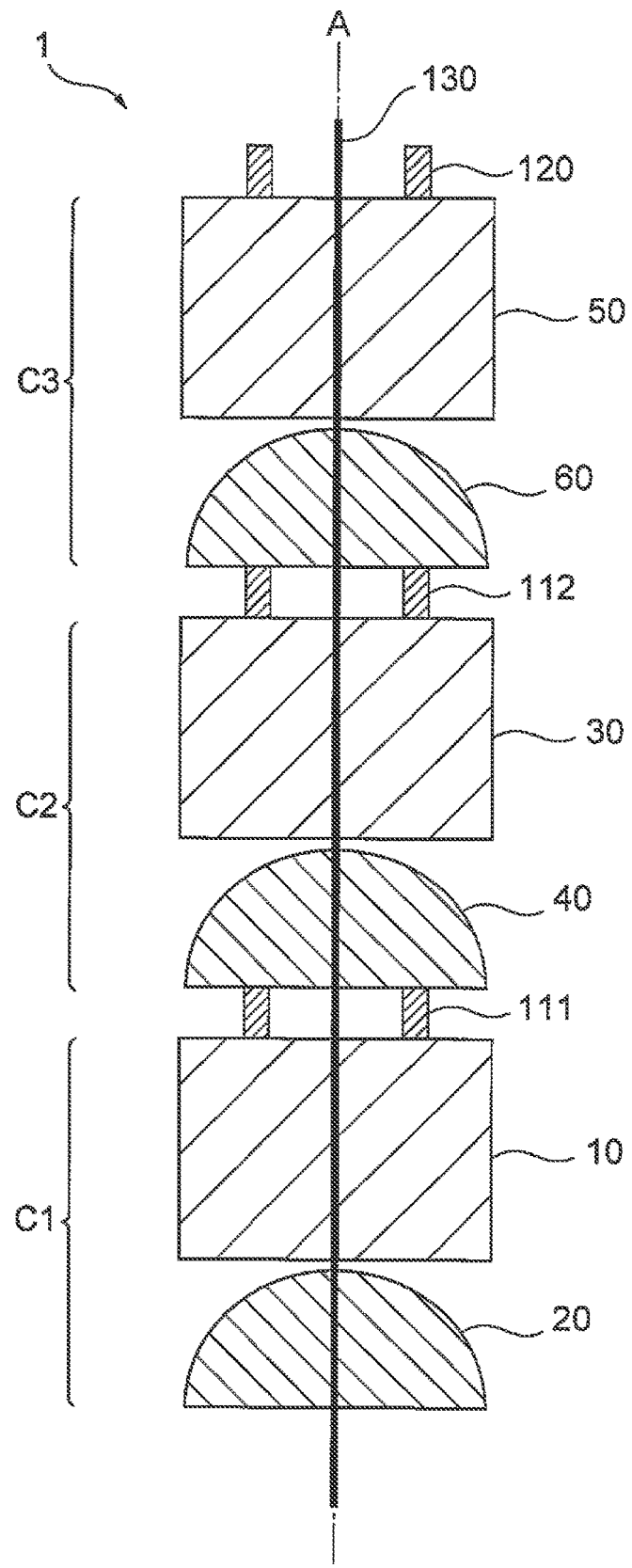
FIG. 5 is a view schematically showing a support member that supports the flexible electrodes and the base electrodes shown in FIG. 1.
Figure 6:
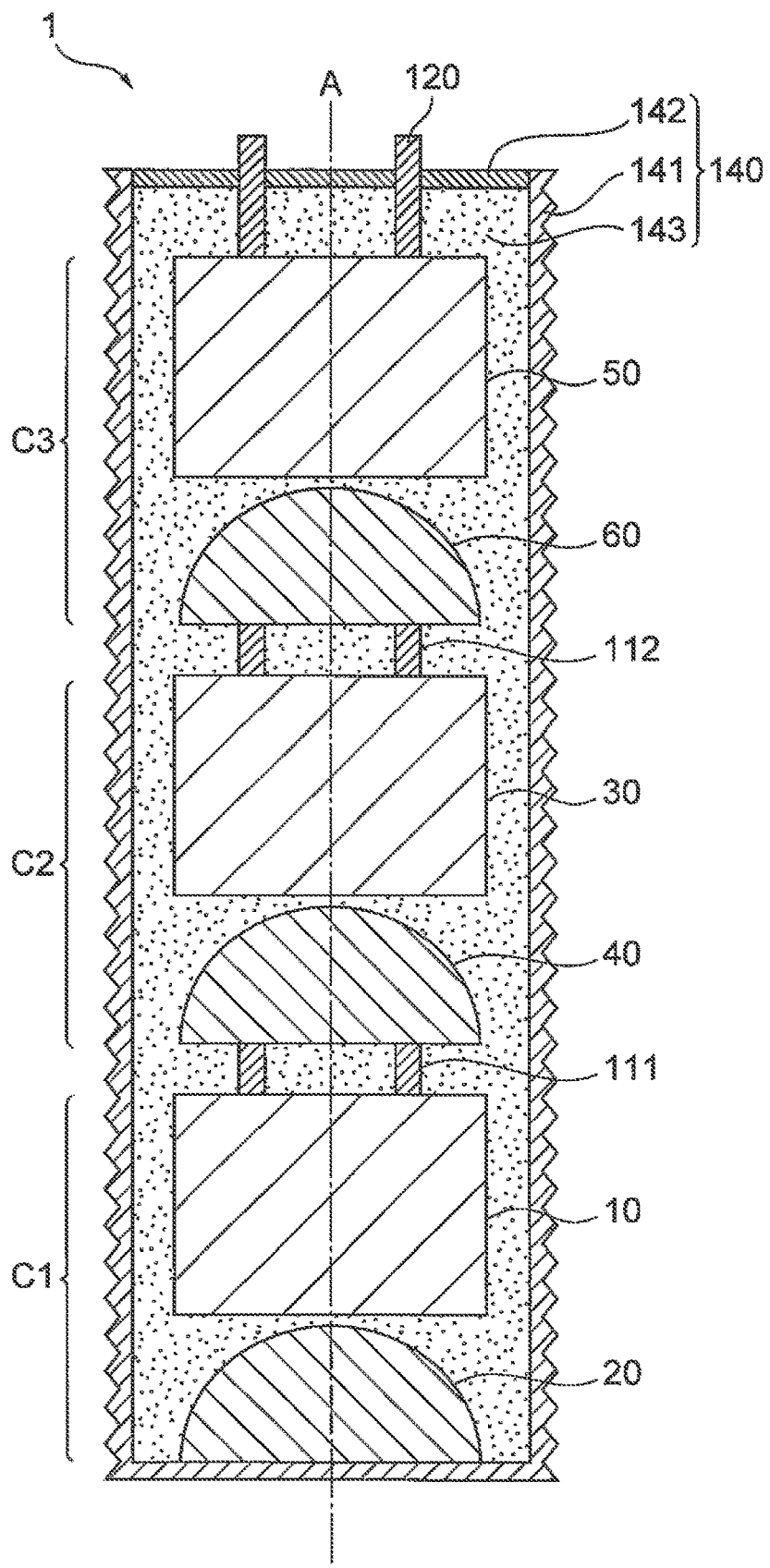
FIG. 6 is a view schematically showing another example of the support member shown in FIG. 5.

FIG. 5 schematically shows a support member 130 that supports the flexible electrodes 2 and the base electrodes 3 shown in FIG. 1. FIG. 5 shows a section of the actuator 1 taken along the axis A. In FIG. 5, two or more electrode portions and an insulating portion that constitute the base electrode 3 of each of the pairs C1 to C3, the insulating layers 22, 42, 62, and the drive circuits 70 to 90 are not illustrated. In FIG. 6 and subsequent drawings, too, these components or portions are not illustrated.

The respective flexible electrodes 2 and base electrodes 3 of the pairs C1 to C3 may be supported by the support member 130 as shown in FIG. 5, for example. The support member 130 is in the form of a rod-like member that extends along the axis A. The support member 130 is formed from an insulating body that can elastically deform in accordance with deformation of the flexible electrodes 2. The support member 130 passes through the respective flexible electrodes 2 and base electrodes 3 of the pairs C1 to C3, and supports the electrodes.

FIG. 6 schematically shows another example of the support member 130 shown in FIG. 5.

The respective flexible electrodes 2 and base electrodes 3 of the pairs C1 to C3 may be supported by a support member 140 as shown in FIG. 6, for example. The support member 140 is in the form of a cylindrical member that extends along the axis A. The support member 140 has a cylindrical case 141 with a bottom, in which the respective flexible electrodes 2 and base electrodes 3 of the pairs C1 to C3 are housed, a stopper 142 that closes an opening of the case 141, and an insulating liquid 143 that fills the interior of the case 141.

The case 141 is formed from an insulating body that can elastically deform in accordance with deformation of the flexible electrodes 2. The stopper 142 is a lid or a plug, for example, which is formed from an insulating body, and prevents the insulating liquid 143 that fills the interior of the case 141 from leaking to the outside of the case 141. The insulating liquid 143 may be a synthetic oil having no toxicity, mineral oil, or a plant-derived insulating oil, or may be a machine oil, such as a lubricating oil. The relative permittivity of the insulating liquid 143 is higher than that of the air.

With the flexible electrodes 2 and the base electrodes 3 thus supported by the support member 140, gaps between the flexible electrodes 2 and the base electrodes 3 are filled with the insulating liquid 143 having a high relative permittivity. Thus, the actuator 1, in which the flexible electrodes 2 and the base electrodes 3 are supported by the support member 140, can increase the amount of electric charge accumulated as voltage is applied to these electrodes 2, 3, and can increase the coulomb force generated between the electrodes 2, 3. Thus, the actuator 1 can increase the amount of deformation of the flexible electrodes 2 and increase the speed of deformation of the flexible electrodes 2, thereby to achieve further increased output.

When the insulating liquid 143 is machine oil having a high viscosity, the insulating liquid 143 may be applied by coating to surfaces of the flexible electrodes 2 and base electrodes 3 supported by the support member 130 shown in FIG. 5. Thus, even when the flexible electrodes 2 and base electrodes 3 are supported by the support member 130, the actuator 1 can increase the amount of deformation of the flexible electrodes 2 and increase the speed of deformation of the flexible electrodes 2, thereby to achieve further increased output.

Second Embodiment

Figure 7:
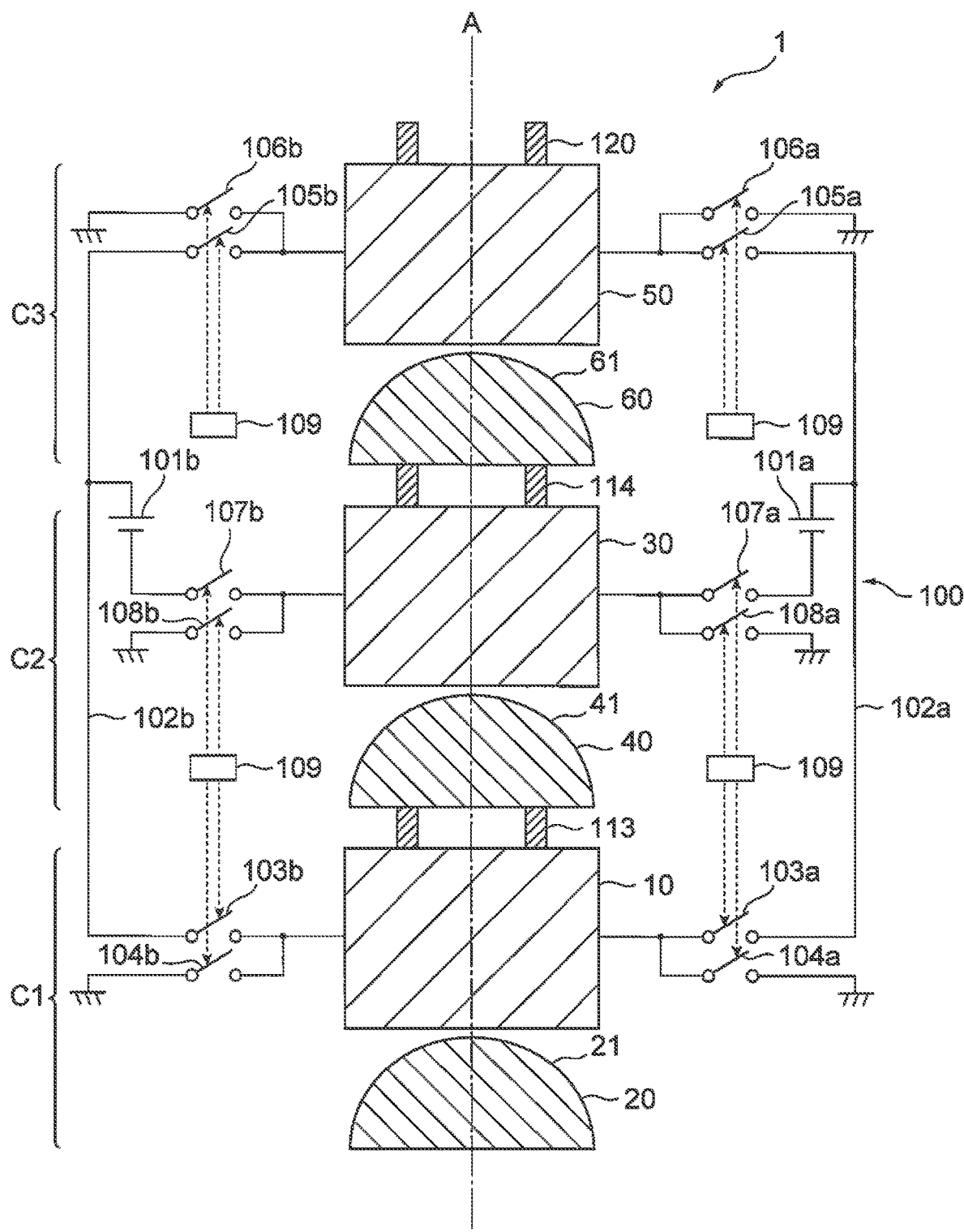
FIG. 7 is a view useful for describing the configuration of an actuator of a second embodiment.

Referring to FIG. 7, an actuator 1 according to a second embodiment will be described. The configuration and operation of the actuator 1 of the second embodiment, which are identical with or similar to those of the previous embodiment, will not be described herein. FIG. 7 is useful for describing the configuration of the actuator 1 of the second embodiment.

In the actuator 1 of the second embodiment, the flexible electrode 2 of one of adjacent ones of the pairs and the base electrode 3 of the other pair are connected by a connecting member 113, 114, in place of the connecting member 111, 112. The connecting member 113 connects the first flexible electrode 10 of the first pair C1 with the second base electrode 40 of the second pair C2. The connecting member 114 connects the second flexible electrode 30 of the second pair C2 with the third base electrode 60 of the third pair C3. The connecting members 113, 114 are formed from conductors. Preferably, each of the connecting members 113, 114 may be formed from a conductor, such as a conductive rubber or a conductive spring, which can elastically deform.

In the actuator 1 of the second embodiment, the connecting members 113, 114 are formed from the conductors; therefore, the first flexible electrode 10 and the second base electrode 40 are at the same electric potential, and the second flexible electrode 30 and the third base electrode 60 are at the same potential. Thus, the actuator 1 of the second embodiment can integrate the first drive circuit 70, second drive circuit 80, and third drive circuit 90, into a drive circuit 100.

The drive circuit 100 includes power supplies 101a, 101b constructed similarly to the power supplies 71a, 71b of the first drive circuit 70, and wirings 102a, 102b that connect each constituent element of the drive circuit 100 with the flexible electrodes 2 and the base electrodes 3. The drive circuit 100 includes switches 103a to 108b constructed similarly to the switches 73a to 76b of the first drive circuit 70, and a controller 109 configured similarly to the controller 77 of the first drive circuit 70.

Each of the first flexible electrode 10 and the third flexible electrode 50 is connected to one of the positive electrode and negative electrode of the power supply 101a via the wiring 102a, and is also connected to the frame ground. The second flexible electrode 30 is connected to the other of the positive electrode and negative electrode of the power supply 101a via the wiring 102a, and is also connected to the frame ground. A switch 103a is connected between the first flexible electrode 10 and the power supply 101a. A switch 104a is connected between the first flexible electrode 10 and the frame ground. A switch 105a is connected between the third flexible electrode 50 and the power supply 101a. A switch 106a is connected between the third flexible electrode 50 and the frame ground. A switch 107a is connected between the second flexible electrode 30 and the power supply 101a. A switch 108a is connected between the second flexible electrode 30 and the frame ground.

Also, each of the first flexible electrode 10 and the third flexible electrode 50 is connected to one of the positive electrode and negative electrode of the power supply 101b via the wiring 102b, and is also connected to the frame ground. The second flexible electrode 30 is connected to the other of the positive electrode and negative electrode of the power supply 101b via the wiring 102b, and is also connected to the frame ground. A switch 103b is connected between the first flexible electrode 10 and the power supply 101b. A switch 104b is connected between the first flexible electrode 10 and the frame ground. A switch 105b is connected between the third flexible electrode 50 and the power supply 101b. A switch 106b is connected between the third flexible electrode 50 and the frame ground. A switch 107b is connected between the second flexible electrode 30 and the power supply 101b. A switch 108b is connected between the second flexible electrode 30 and the frame ground.

In the drive circuit 100, when the switches 103a, 105a, 107a are controlled to the ON states, and the switches 104a, 106a, 108a are controlled to the OFF states, a voltage is applied to each of the first flexible electrode 10 and the third flexible electrode 50, and the second flexible electrode 30. As described above, the first flexible electrode 10 and the second base electrode 40 are at the same potential, and the second flexible electrode 30 and the third base electrode 60 are at the same potential. Thus, a voltage is generated between the second flexible electrode 30 and the second base electrode 40, and a voltage is generated between the third flexible electrode 50 and the third base electrode 60. The second flexible electrode 30 deforms so as to get closer to the opposed face 41 of one electrode portion 45a of the second base electrode 40, under coulomb force generated between the second flexible electrode 30 and the second base electrode 40. The third flexible electrode 50 deforms so as to get closer to the opposed face 61 of one electrode portion 65a of the third base electrode 60, under coulomb force generated between the third flexible electrode 50 and the third base electrode 60. As a result, the output member 120 is displaced so as to be inclined relative to the axis A, in the same direction as that indicated by arrow M1 shown in FIG. 3.

Then, in the drive circuit 100, when the switches 103a, 105a, 107a are controlled to the OFF states, and the switches 104a, 106a, 108a are controlled to the ON states, application of voltage to each of the first flexible electrode 10 and the third flexible electrode 50, and the second flexible electrode 30, is stopped. Each of the second flexible electrode 30 and the third flexible electrode 50 reverts to its original shape. As a result, the output member 120 returns to the initial position.

Then, in the drive circuit 100, when the switches 103b to 108b are controlled similarly to the above switches 103a to 108a, the output member 120 is displaced to be inclined relative to the axis A, in a direction opposite to arrow M1 shown in FIG. 3, and then returns to the initial position. The drive circuit 100 repeats application of voltage and stop of the application as described above, so that the actuator 1 of the second embodiment can achieve swinging motions to swing the output member 120 in directions intersecting with the axis A, as in the first embodiment.

As described above, the actuator 1 of the second embodiment, in which the connecting members 113, 114 are formed from the conductors, allows the configuration of the drive circuit 100 to be simpler than that of the first embodiment, while achieving complex motions as in the first embodiment. Thus, the actuator 1 of the second embodiment can easily achieve complex motions.

In the drive circuit 100 shown in FIG. 7, no voltage is applied to the first flexible electrode 10 and the first base electrode 20. However, in the drive circuit 100, for example, the one electrode portion 25a of the first base electrode 20 may be connected via a switch to the other of the positive electrode and negative electrode of the power supply 101a, via the wiring 102a, and may be connected to the frame ground via a switch. Similarly, in the drive circuit 100, for example, the other electrode portion 25b of the first base electrode 20 may be connected via a switch to the other of the positive electrode and negative electrode of the power supply 101b, via the wiring 102b, and may be connected to the frame ground via a switch. With this arrangement, in the actuator 1 of the second embodiment, a voltage can be applied to the first flexible electrode 10 and the first base electrode 20, so that the first flexible electrode 10 can deform so as to get closer to the opposed face 21 of the one electrode portion 25a or the other electrode portion 25b. As a result, the amount of displacement of the output member 120 can be increased, and the actuator 1 of the second embodiment can achieve high output.

Third Embodiment

Figure 8:
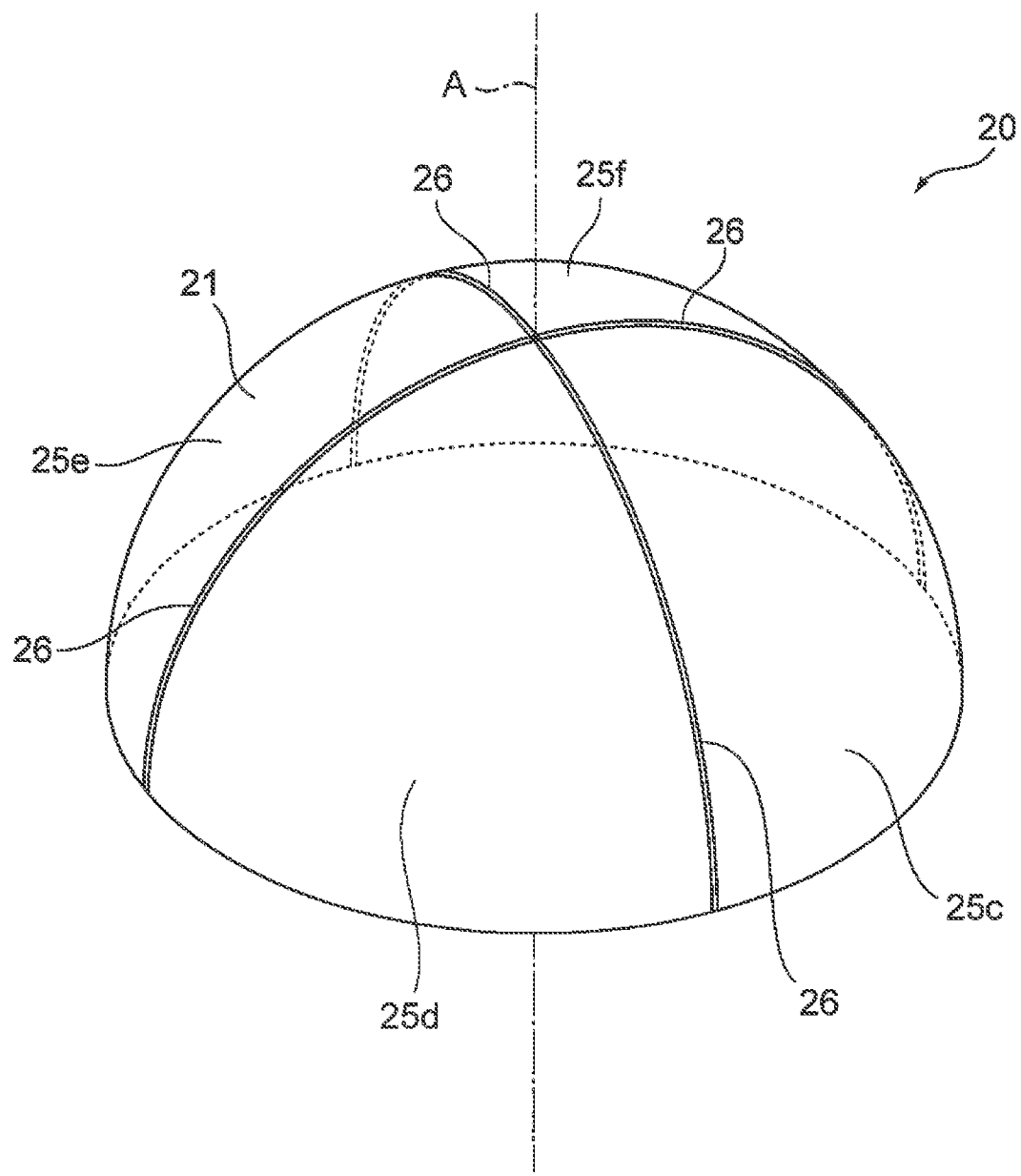
FIG. 8 is a view useful for describing the configuration of an actuator of a third embodiment.
Figure 9:
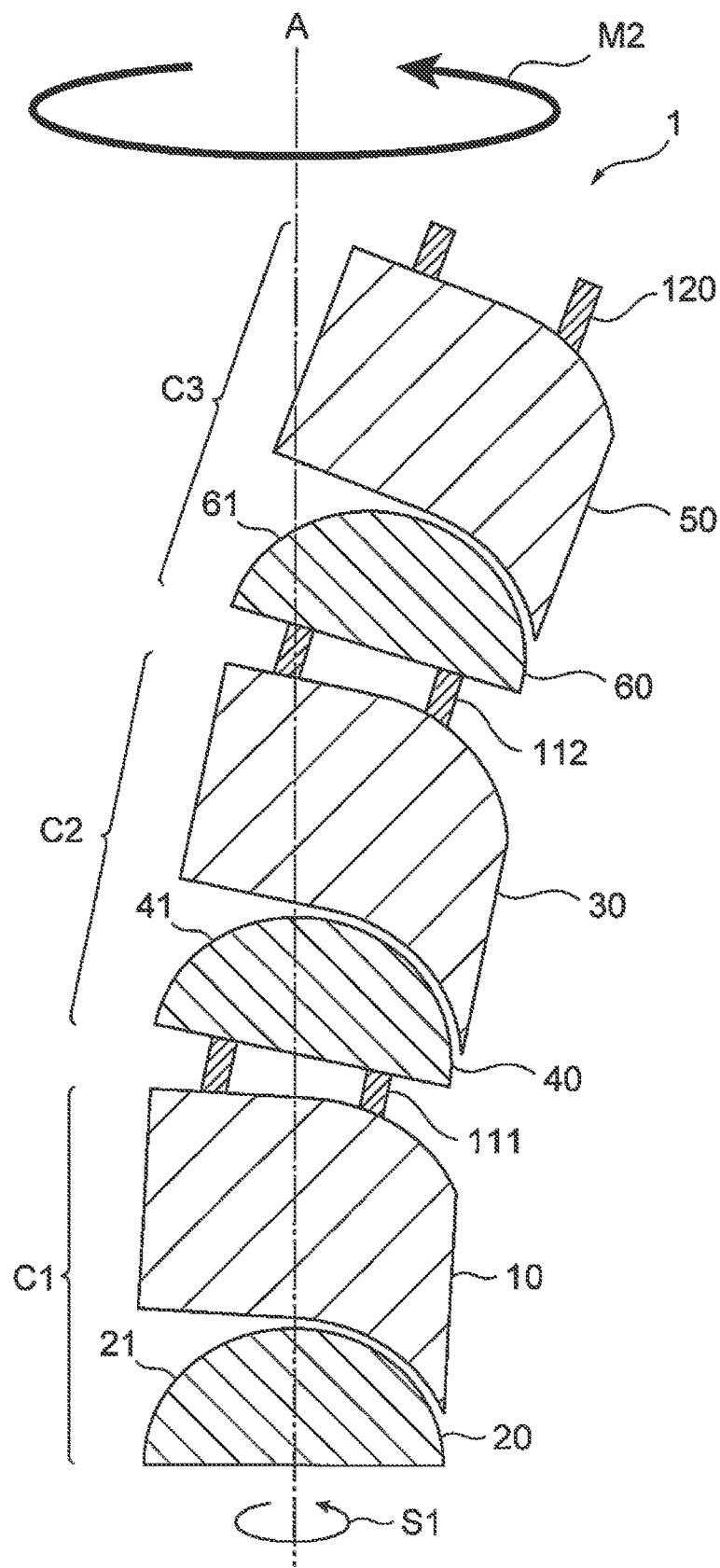
FIG. 9 is a view illustrating the actuator in a condition where voltages are applied to flexible electrodes and base electrodes shown in FIG. 8.

Referring to FIG. 8 and FIG. 9, an actuator 1 of a third embodiment will be described. The configuration and operation of the actuator 1 of the third embodiment, which are identical with or similar to those of the previous embodiments, will not be described herein. FIG. 8 is useful for describing the configuration of the actuator 1 of the third embodiment. FIG. 8 corresponds to FIG. 2.

In the actuator 1 of the third embodiment, the base electrode 3 is divided into three or more electrode portions. The number of the electrode portions into which the base electrode 3 is divided is arbitrarily selected. For example, the first base electrode 20 of the third embodiment may be divided into a plurality of electrode portions 25c to 25f, as shown in FIG. 8.

The electrode portions 25c to 25f are insulated from each other by insulating portions 26, as in the first embodiment. Voltages are individually applied to the respective electrode portions 25c to 25f, and the first flexible electrode 10. The electrode portions 25c to 25f are arranged along an orbital direction of the axis A. The electrode portions 25c to 25f may be formed by dividing the first base electrode 20 equiangularly in the orbital direction of the axis A. Voltages are applied to the electrode portions 25c to 25f and the first flexible electrode 10, in sequence along the orbital direction of the axis A. The second base electrode 40 and the third base electrode 60 of the third embodiment are constructed similarly to the first base electrode 20 of the third embodiment.

FIG. 9 is a view useful for describing the actuator 1 in a condition where voltages are applied to the flexible electrodes 2 and the base electrodes 3 as shown in FIG. 8.

When voltages are sequentially applied to the electrode portions 25c to 25f that constitute the first base electrode 20, along the orbital direction of the axis A, as indicated by arrow S1 in FIG. 9, the first flexible electrode 10 deforms sequentially so as to get closer to the respective opposed faces 21 of the electrode portions 25c to 25f. When voltages are sequentially applied to a plurality of electrode portions that constitutes each of the second base electrode 40 and the third base electrode 60, similarly to the electrode portions 25c to 25f, each of the second flexible electrode 30 and the third flexible electrode 50 deforms sequentially, like the first flexible electrode 10.

Each of the drive circuits 70 to 90 can sequentially apply voltages to the electrode portions that constitute the base electrode 3 along the orbital direction of the axis A, in the same direction with respect to each of the pairs C1 to C3. As a result, the output member 120 is displaced so as to turn around the axis A, as indicated by arrow M2 in FIG. 9.

In this connection, each of the drive circuits 70 to 90 need not sequentially apply voltages to the electrode portions that constitute the base electrode 3 along the orbital direction of the axis A, at the same time with respect to all of the pairs C1 to C3, but may apply the voltages at different times for the respective pairs C1 to C3. For example, the drive circuits 70 to 90 may apply the voltages in sequence from the first pair C1 located farthest from the output member 120, to the third pair C3 to which the output member 120 is attached. In this manner, the actuator 1 can smoothly turn the output member 120.

As described above, the actuator 1 of the third embodiment can achieve turning motion to turn the output member 120 in the orbital direction of the axis A, by sequentially applying voltages to the electrode portions that constitute the base electrode 3, along the orbital direction of the axis A. Thus, the actuator 1 of the third embodiment can achieve complex motions of the output member 120.

Fourth Embodiment

Figure 10:
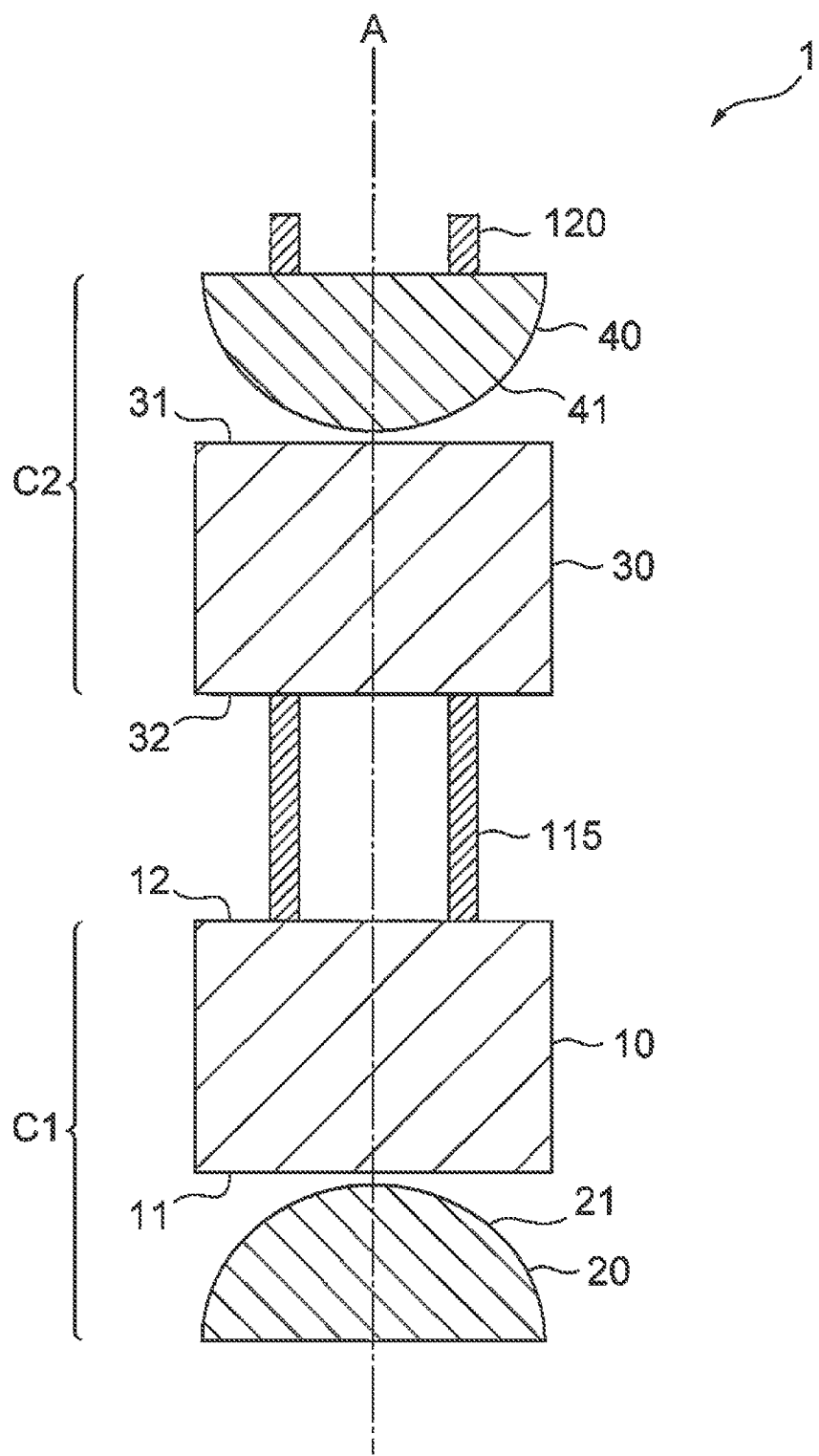
FIG. 10 is a view useful for describing an actuator of a fourth embodiment.
Figure 11:
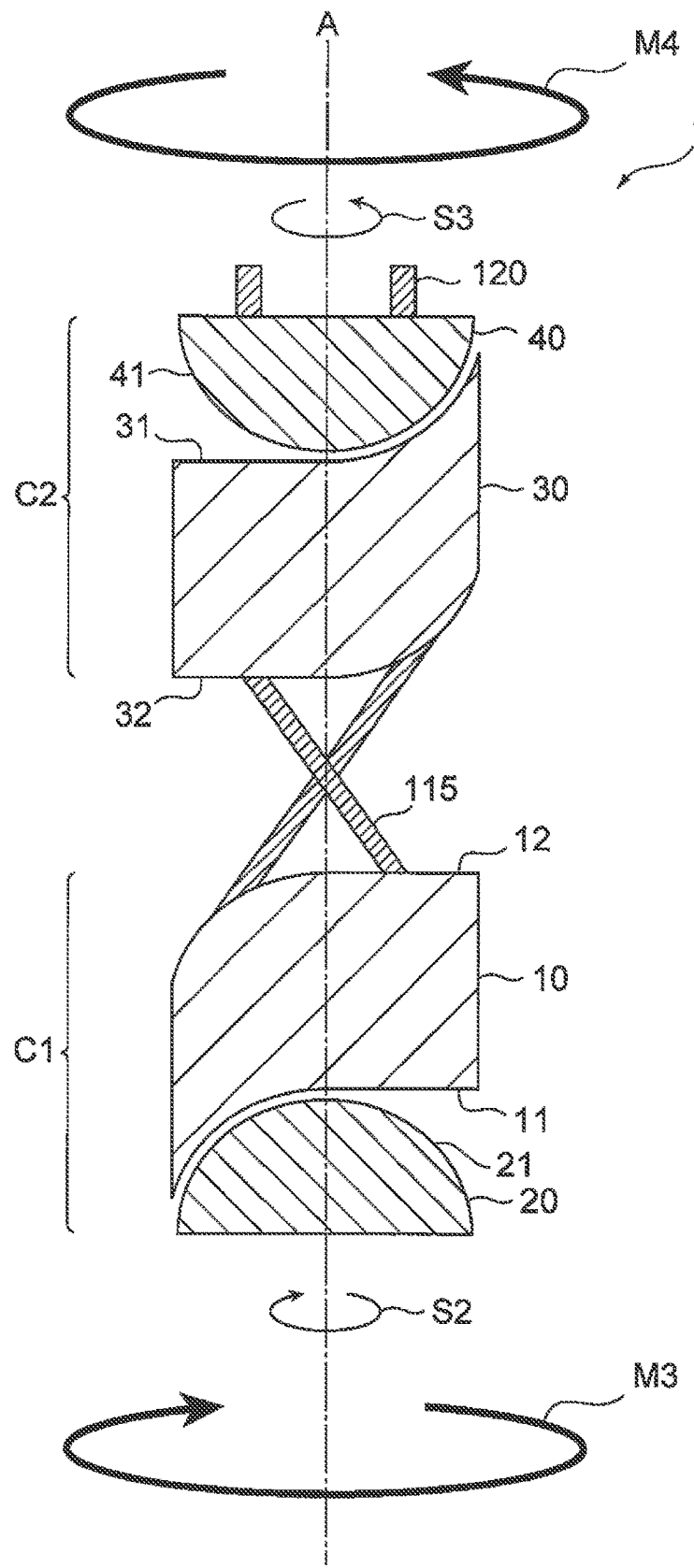
FIG. 11 is a view illustrating the actuator in a condition where voltages are applied to flexible electrodes and base electrodes shown in FIG. 10.

Referring to FIG. 10 and FIG. 11, an actuator 1 according to a fourth embodiment will be described. The configuration and operation of the actuator 1 of the fourth embodiment, which are identical with or similar to those of the previous embodiments, will not be described herein. FIG. 10 is useful for describing the configuration of the actuator 1 of the fourth embodiment.

In the actuator 1 of the fourth embodiment, the flexible electrode 2 of one of adjacent pairs and the flexible electrode 2 of the other pair are opposed to each other and located on the same axis A, and are connected by a connecting member 115. For example, in the actuator 1 of the fourth embodiment, the first flexible electrode 10 of the first pair C1 and the second flexible electrode 30 of the second pair C2 are opposed to each other with a gap provided therebetween, and are located on the same axis A, as shown in FIG. 10. The first flexible electrode 10 of the first pair C1 and the second flexible electrode 30 of the second pair C2 are connected by the connecting member 115 disposed in the gap. The output member 120 is attached to a face of the second base electrode 40 opposite to the opposed face 41 as viewed in the direction of extension of the axis A.

The first base electrode 20 of the fourth embodiment is divided into a plurality of electrode portions 25c to 25f arranged in the orbital direction of the axis A, as in the third embodiment. Voltages applied to the first base electrode 20 and the first flexible electrode 10 are sequentially applied to the electrode portions 25c to 25f along the orbital direction of the axis A. The second base electrode 40 of the fourth embodiment is constructed similarly to the first base electrode 20 of the fourth embodiment.

The connecting member 115 is formed from an insulating body. Preferably, the connecting member 115 may be formed from an insulating body, such as an insulating rubber or insulating spring, which is able to elastically deform.

FIG. 11 illustrates the actuator 1 in a condition where voltages are applied to the flexible electrodes 2 and the base electrodes 3 shown in FIG. 10.

When voltages are sequentially applied to the electrode portions 25*c* to 25*f* that constitute the first base electrode 20, along the orbital direction of the axis A, as indicated by arrow S2 in FIG. 11, the first flexible electrode 10 sequentially deforms so as to get closer to the respective opposed faces 21 of the electrode portions 25*c* to 25*f*. As a result, the second flexible electrode 30 and the second base electrode 40 of the second pair C2 tend to turn along the orbital direction of the axis A, as indicated by arrow M4 in FIG. 11.

At the same time, when voltages are sequentially applied to the electrode portions that constitute the second base electrode 40, along the orbital direction of the axis A, as indicated by arrow S3 in FIG. 11, the second flexible electrode 30 sequentially deforms so as to get closer to the respective opposed faces 41 of the electrode portions that constitute the second base electrode 40. As a result, the first flexible electrode 10 and the first base electrode 20 of the first pair C1 tend to turn along the orbital direction of the axis A, as indicated by arrow M3 in FIG. 11.

Here, as shown in FIG. 11, the order of application of voltage in the first base electrode 20 (arrow S2) and the order of application of voltage in the second base electrode 40 (arrow S3) are opposite to each other along the orbital direction of the axis A. In this case, the turning direction (arrow M3) of the first flexible electrode 10 and the turning direction (arrow M4) of the second flexible electrode 30 are opposite to each other, so that the first flexible electrode 10 and the second flexible electrode 30 deform so as to be twisted about the axis A as the central axis.

Namely, the drive circuits 70, 80 sequentially apply voltages to the electrode portions that constitute the base electrodes 3, along the orbital directions of the axis A, such that the direction of application of voltage to the first pair C1 is opposite to that of application of voltage to the second pair C2. At this time, the drive circuits 70, 80 apply the same amount of the voltage to the respective pairs C1, C2, at the same time. As a result, the actuator 1 of the fourth embodiment can achieve twisting motion about the axis A as the central axis. With the twisting motion, the second base electrode 40 to which the output member 120 is attached rotates about itself in the orbital direction of the axis A. As the second base electrode 40 rotates about itself, the output member 120 is displaced so as to rotate in the orbital direction of the axis A, without causing movement of the center of gravity.

As described above, in the actuator 1 of the fourth embodiment, the flexible electrode 2 of one of adjacent pairs and the flexible electrode 2 of the other pair are opposed to each other, and connected by the connecting member 115 formed from the insulating body. With this arrangement, the actuator 1 of the fourth embodiment can achieve twisting motion about the axis A as the central axis. Thus, the actuator 1 of the fourth embodiment can achieve complex motions of the output member 120.

Further, when the connecting member 115 is formed from the insulating body that is able to elastically deform, in the actuator 1 of the fourth embodiment, the amount of displacement of the output member 120 can be increased, and the output member 120 can easily return to the initial position, so that the actuator 1 can achieve high output.

In the actuator 1 shown in FIG. 10 and FIG. 11, the third flexible electrode 50 and the third base electrode 60 of the third pair C3 are not illustrated. However, in the actuator 1 of the fourth embodiment, the third flexible electrode 50 may be connected to the first base electrode 20 via a connecting member similar to the connecting member 111, so that the third pair C3 can be connected to the first pair C1.

While some embodiments of the disclosure have been described in detail, the disclosure is not limited to the illustrated embodiments, but various changes may be made without departing from the principle of the disclosure described in the appended claims. According to the disclosure, the configuration of a certain embodiment may be added to the configuration of another embodiment, or the configuration of a certain embodiment may be replaced with that of another embodiment, or a part of the configuration of a certain embodiment may be deleted.

What is claimed is:

1. An actuator comprising a plurality of pairs of a flexible electrode having flexibility, and a base electrode having an opposed face that is opposed to the flexible electrode and is covered with an insulating layer, the flexible electrode being configured to deform to get closer to the opposed face when a voltage is applied to the flexible electrode and the base electrode,
    wherein each of the pairs is located on the same axis, and adjacent ones of the pairs are connected to each other, the axis intersecting with the opposed face of the base electrode of each of the pairs, and
    wherein the base electrode of each of the pairs is divided into a plurality of electrode portions insulated from each other, and the voltage is individually applied to the electrode portions; and wherein:
    the base electrode is formed in a shape of a dome having a top portion at a position opposed to the flexible electrode;
    the electrode portions are arranged along an orbital direction of the axis; and
    the voltage is sequentially applied to the electrode portions along the orbital direction.

2. The actuator according to claim 1, wherein:
    the flexible electrode of one of adjacent ones of the pairs and the base electrode of the other pair are connected by a connecting member; and
    the connecting member comprises an elastic body.

3. The actuator according to claim 1, wherein:
    the flexible electrode of one of adjacent ones of the pairs and the base electrode of the other pair are connected by a connecting member; and
    the connecting member comprises a conductor.

4. The actuator according to claim 1, wherein:
    the flexible electrode of one of adjacent ones of the pairs and the flexible electrode of the other pair are opposed to each other, and are connected by a connecting member; and
    the connecting member comprises an insulating body.

* * * * *